(12) United States Patent
Chong et al.

(10) Patent No.: US 10,665,591 B2
(45) Date of Patent: May 26, 2020

(54) TRANSISTOR GATE ARRANGEMENT TO MODIFY DRIVER SIGNAL CHARACTERISTICS

(71) Applicant: Arm Limited, Cambridge (GB)

(72) Inventors: Yew Keong Chong, Austin, TX (US); Sriram Thyagarajan, Austin, TX (US); Kumaraswamy Ramanathan, Austin, TX (US); Damayanti Datta, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/122,752

(22) Filed: Sep. 5, 2018

(65) Prior Publication Data

US 2020/0075591 A1     Mar. 5, 2020

(51) Int. Cl.
*H01L 27/092* (2006.01)
*H01L 29/78* (2006.01)
*H01L 21/8238* (2006.01)
*G11C 11/40* (2006.01)
*H03K 3/012* (2006.01)

(52) U.S. Cl.
CPC .......... *H01L 27/092* (2013.01); *G11C 11/40* (2013.01); *H01L 21/823814* (2013.01); *H01L 29/7842* (2013.01); *H03K 3/012* (2013.01)

(58) Field of Classification Search
CPC .......... H01L 27/092; H01L 21/823814; H01L 29/7842; H03K 3/012
See application file for complete search history.

(56) References Cited

U.S. PATENT DOCUMENTS 5,532,509 A * 7/1996 D'Addeo ............. H01L 27/092
257/369

OTHER PUBLICATIONS

Cremer, et al.; Automatic Cell Layout in the 7nm Era; Proceedings of the 2017 ACM International Symposium on Physical Design (ISPD'17); pp. 99-106; ACM; 2017. DOI: 10.1145/3036669.3036672.
Faricelli, John; Layout-Dependent Proximity Effects in Deep Nanoscale CMOS; AMD; Apr. 16, 2009.

* cited by examiner

*Primary Examiner* — Hsien Ming Lee
(74) *Attorney, Agent, or Firm* — Pramudji Law Group PLLC; Ari Pramudji

(57) ABSTRACT

Briefly, embodiments of claimed subject matter relate to devices and methods for modifying, such as decreasing rise time and/or fall time, of a driver signal output. To achieve such modifications in driver output signals, additional gates may be positioned at PMOS and/or NMOS regions of a semiconductor film. In addition, at least in particular embodiments, etching of portions of one or more semiconductor regions may increase compressive or tensile stress, which may further operate to modify driver output signals.

13 Claims, 4 Drawing Sheets

TRANSISTOR GATE ARRANGEMENT TO MODIFY DRIVER SIGNAL CHARACTERISTICS

TECHNICAL FIELD

This disclosure relates to fabrication of transistors structures to modify driver signal characteristics such as, for example, to provide signals having reduced rise time and/or reduced fall time.

BACKGROUND

In many computing devices, such as laptop or desktop computers, smart phones, gaming devices, and so forth, a signal driver may be utilized to activate, for example, one or more other devices, such as memory devices. These devices may, for example, bring about changes in memory states of a nonvolatile memory circuit in response to the signal driver providing an output waveform having a magnitude sufficient to initiate a memory operation. Thus, it may be appreciated that if an output waveform of a signal driver does not achieve a sufficient magnitude in a timely fashion, memory operations, such as reading memory states of a device and/or writing memory states to a device, may be delayed.

While some signal drivers may provide output waveforms that rapidly achieve a sufficient magnitude to initiate memory operations, for example, many such signal drivers may not be capable of providing such waveforms at increased current levels. Accordingly, to provide output signal waveforms capable of driving, for example, two or more memory devices operating in parallel, additional signal drivers may be required. Thus, providing signal drivers capable of providing output waveforms having relatively short rise times, for example, at increased current levels continues to be an active area of investigation.

BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, circuits or apparatuses described herein.

Figure 1A:
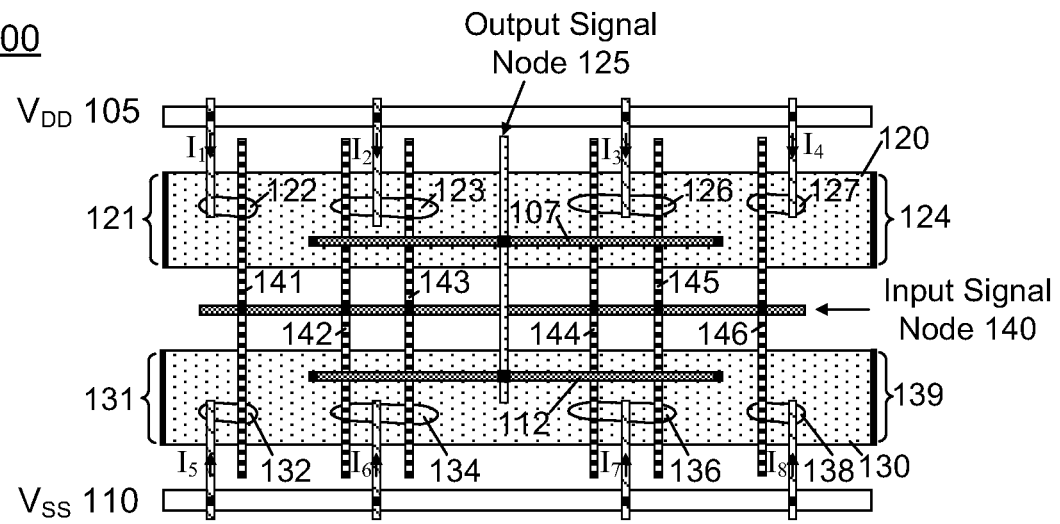
FIG. 1A is a schematic diagram illustrating an arrangement of transistor gates capable of modifying driver signal characteristics, according to an embodiment.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

As previously discussed, in a computing device, such as a laptop or desktop computer, smart phone, gaming device, or the like, a signal driver may be utilized to provide signals, which may be in the form of voltages and/or electrical currents above threshold levels. Such signals may, for example, initiate downstream processes such as memory storage and/or memory read operations. Thus, at least in some embodiments, if an output waveform of the signal driver does not achieve sufficient current and/or voltage magnitude in a timely fashion, memory operations, for example, may be delayed. System designers may place a premium on providing driver signals that quickly attain threshold current and/or voltage levels so that, for example, memory operations may be initiated with minimal delay.

However, although some signal drivers may generate signal waveforms that rapidly attain threshold voltage magnitudes, at least some signal drivers may not be capable of providing such signals at increased current levels. Accordingly, rather than utilizing one driver to fan out to four or more devices so that a corresponding number of device operations may be simultaneously initiated, a larger number of signal drivers, such as two or more, may be required to initiate device operations. Hence, at least for certain applications, a premium may be placed on providing output waveforms that quickly attain threshold voltage magnitudes at increased current levels.

In addition to generating signal waveforms that rapidly attain threshold voltage magnitudes, a premium may be placed on providing signals that rapidly fall below a threshold voltage to indicate that an operation, such as a memory read operation, is to be terminated. In particular embodiments, providing signals that rapidly fall below a threshold may permit downstream operations to be initiated. In one example, in a memory interface circuit environment, it may be beneficial for an address strobe signal to fall below a threshold level so that memory read or write operations can be performed at a selected memory address. In such an environment, a delay in returning an address strobe signal to a level below a threshold value may bring about a delay in memory read/write operations. Further, it may be desirable for a signal driver to comprise additional features such as reduced leakage current, e.g., during "off" state operation.

Reduced leakage current may bring about reduced power consumption of a signal driver, longer battery life, lower operating temperature, for example.

In particular embodiments of claimed subject matter, a signal driver, may be fabricated utilizing complementary metal oxide semiconductor film (CMOS) comprising a N-type metal oxide semiconductor (NMOS) region as well as a P-type metal oxide semiconductor (PMOS) region. A signal driver may utilize a plurality, such as 2, 4, 6, 8, 10, or a larger number of polysilicon gate regions, which may be placed into contact with localized diffusion regions of a NMOS or PMOS regions of a semiconductor film. Responsive to receipt of an input signal at an input signal node, for example, one or more voltage signals may be coupled from a common source voltage to an output signal node of the signal driver.

In one embodiment, one or more performance parameters, such as a time required for a signal driver to attain a threshold voltage magnitude responsive to receipt of a signal at an input signal node, may be reduced by insertion of one or more inactive "floating gates" on or over a CMOS semiconductor film. In this context, a "floating gate" is defined as a gate region of a transistor which is uncoupled from an output signal node. As described further herein, use of one or more floating gates may bring about an increase in magnitude of a signal present at gate corresponding to an active PMOS or NMOS transistor. Responsive to an increase in a signal level present at one or more gates corresponding to active PMOS or NMOS transistors, a time required for a signal driver to attain a threshold voltage magnitude may be decreased. Such decreases in time required for a signal driver to attain a threshold voltage magnitude may expedite various downstream or subsequent computer operations, and claimed subject matter is not limited in this respect.

In another embodiment, one or more floating gates may be etched by way of a suitable etching process, such as a wet etch, for example, which may bring about additional changes in performance parameters. An etching process may be applied to virtually an entire length of a floating gate region or may be applied to a small portion of a floating gate region. An etching process applied to a floating gate region may give rise to a "stress effect" of a semiconductor film, which, in this context, may be defined as a compressive force or a tensile force applied to localized diffusion regions responsive to an etching process. For example, a compressive stress effect, which may reduce time required for a signal driver to attain a threshold voltage magnitude in a PMOS semiconductor film, may occur in a diffusion region separated from an etched region. In another example, a tensile stress effect, which may reduce time required for signal driver to attain a threshold voltage magnitude in a NMOS semiconductor film, may occur in a diffusion region adjacent to an etched region.

In another embodiment, one or more floating gate regions may be etched so as to cut or sever an electrical connection between portions of a floating gate region. In one embodiment, a floating gate region that extends from an NMOS region of a semiconductor film to a PMOS region of a semiconductor film may be etched in a region between a first floating gate region (e.g., a NMOS region of a semiconductor film) and a second floating gate region (e.g., a PMOS region of the semiconductor film).

Before discussing embodiments in reference to the accompanying figures, a brief description of various non-limiting embodiments is provided. For example, a device to provide an electrical signal may comprise an array of voltage signal input conductors, which may be disposed in a spaced relation over a semiconductor film. The array of voltage signal input conductors may provide a voltage signal to corresponding localized diffusion regions of the semiconductor film, wherein the semiconductor film includes one or more gate regions coupled to a common switched output signal node. In one embodiment, a common switched output signal node may provide an output signal responsive to the voltage signal at an input signal node. In another embodiment, the one or more gate regions may correspond in number to the localized diffusion regions. The semiconductor film may comprise at least one additional gate region, which may correspond to a floating gate region, wherein the at least one additional gate region uncoupled to the common switched output signal node.

Another embodiment may relate to a method for providing an electrical signal comprising forming a semiconductor film having a plurality of localized diffusion regions. The method may continue with forming gate regions corresponding to the plurality of localized diffusion regions, wherein the gate regions may be configured to control current conducted through the plurality of localized diffusion regions from an input node to an output signal node. The method may further comprise forming one or more additional gate regions, which may comprise floating gate regions, which may be uncoupled from the output signal node.

Another embodiment may refer to a device to provide electrical signals to a plurality of external devices, wherein the device may comprise a plurality of voltage signal input conductors, separated by a substantially constant spacing, over a semiconductor film. The plurality of voltage signal input conductors may provide the voltage signal to corresponding localized diffusion regions of the semiconductor film. The semiconductor film may include one or more gate regions coupled to a common switched output signal node to provide an output signal responsive to a signal at an input signal node. In one embodiment, the one or more gate regions may overlay the corresponding localized diffusion regions. The device may additionally comprise at least one additional gate region of the semiconductor film, wherein the at least one additional gate region is uncoupled from the common switched output signal node.

Particular embodiments will now be described with reference to the figures, such as FIG. 1A, which comprises a schematic diagram (100) illustrating an arrangement of transistor gates capable of modifying driver signal characteristics, in accordance with various embodiments described herein. In FIG. 1A, PMOS region 120 of a semiconductor film and NMOS region 130 of the semiconductor film may be fabricated at a device layer, such as during front-end-of-line (FEOL) wafer fabrication processes. Localized diffusion regions 122, 123, 126, and 127 may be formed from PMOS region 120 of the semiconductor film. Similarly, localized diffusion regions 132, 134, 136, and 138 may be formed from NMOS region 130 of a semiconductor film. Localized diffusion regions and semiconductor films may be fabricated utilizing any appropriate fabrication process, such as atomic layer deposition, chemical vapor deposition, sputter deposition, for example. It should be noted that localized diffusion regions shown in FIG. 1A may comprise any shape that permits a current (e.g., $I_1$) to conduct between, for example, common source voltage 105 and output signal line 107 by way of controlling a voltage signal at input signal node 140. It should additionally be noted that although successive localized diffusion regions of PMOS region 120 and NMOS region 130 are shown in FIG. 1A as being separated by a substantially constant interval, claimed subject matter is intended to embrace any spacing intervals between or among localized diffusion regions.

Gate regions 141, 142, 143, 144, 145, and 146 may be formed over PMOS region 120 of the semiconductor film and region 130 of the semiconductor film, so as to come into electrical contact with localized diffusion regions 122, 123, 126, and 127. Additionally, gate regions 141, 142, 143, 144, 145, and 146 may additionally come into electrical contact with gate regions 132, 134, 136, and 138. In FIG. 1A, gate regions 141-146 may be formed from, for example, a polycrystalline silicon material comprising a dopant concentration of between $1 \times 10^{20}$ cm$^{-3}$ and $5 \times 10^{20}$ cm$^{-3}$. However, gate regions 141-146 may comprise other suitably conductive materials, and claimed subject matter is not limited in this respect.

Input signal node 140 may comprise a conductive material formed, such as at a metal-1 layer or M1 layer, which lies over gate regions 141, 142, 143, 144, 145, and 146. In schematic diagram 100, one or more vias may be utilized to provide electrical connection between conductive material forming input signal node 140 and gate regions 141, 142, 143, 144, 145, and 146. Additionally, one or more vias may be utilized to provide electrical connection between output signal line 107, which may also be formed at a M1 layer, and output signal node 125, which may be formed at a metal-2 or M2 layer. Likewise, one or more vias may be utilized to provide electrical connection between output signal line 112, formed at a M1 layer, and output signal node 125. Thus, for example, when a signal comprising an appropriate magnitude is present at input signal node 140, for example, an electrical current, such as $I_1$, may be permitted to conduct from common source voltage 105 ($V_{DD}$) through localized diffusion region 122 to output signal node 125. Electric current $I_1$ may be conducted through a channel formed within PMOS region 120 (not shown in FIG. 1A). Similarly, also responsive to a signal comprising an appropriate magnitude at input signal node 140, electric currents $I_2$, $I_3$, $I_4$, $I_5$, $I_6$, $I_7$, and $I_8$ may also be permitted to conduct from an array of conductors, arranged in a spaced relation from one another, from common source voltage 105 ($V_{DD}$) and 110 ($V_{SS}$) to output signal lines 107/112 to be supplied to output signal node 125.

PMOS region 120 may be substantially isolated from adjacent PMOS regions, not shown in FIG. 1A, by way of etch boundary 121 (shown at the left side of PMOS region 120) and by way of etch boundary 124 (shown at the right side of PMOS region 120). In an embodiment, such separation provides electrical isolation between adjacent PMOS regions of a semiconductor wafer. Likewise, NMOS region 130 may be substantially isolated from adjacent NMOS regions, not shown in FIG. 1A, by way of etch boundary 131 (shown at the left side of NMOS region 130) and by way of etch boundary 139 (shown at the right side of a NMOS region 130). In one embodiment, such separation provides electrical isolation between adjacent NMOS regions of a semiconductor wafer.

It may be appreciated from the diagram of FIG. 1A that electric currents $I_1$ and $I_4$ conduct from common source voltage 105 ($V_{DD}$) to a localized diffusion region coming into contact with a single gate region. For example, in FIG. 1A, electric current $I_1$ may conduct through localized diffusion region 122 that spans an area coming into contact with gate region 141 to output signal line 107. Likewise, electric current $I_4$ may conduct through localized diffusion region 127 that spans an area coming into contact with gate region 146 to output signal line 107. However, it may also be appreciated from the diagram of FIG. 1A, that electric currents $I_2$ and $I_3$ may conduct through a somewhat larger localized diffusion region that spans an area coming into contact with two gate regions. For example, electric current $I_2$ may conduct through localized diffusion region 123 that spans an area coming into contact with gate regions 142 and 143 to output signal line 107. Likewise, electric current $I_3$ may conduct through localized diffusion region 126 that spans an area coming into contact with gate regions 144 and 145 to output signal line 107. As shown in FIG. 1A, conductors positioned between common source voltage 105 ($V_{DD}$) and localized diffusion regions may comprise substantially similar width and thickness dimensions.

Similarly, it may also be appreciated from the diagram of FIG. 1A that electric currents $I_5$ and $I_8$ may conduct from common source voltage 110 ($V_{SS}$) to a localized diffusion region coming into contact with a single gate region. For example, electric current $I_5$ may conduct through localized diffusion region 132 that spans an area coming into contact with gate region 141 to output signal line 112. Likewise, electric current $I_8$ may conduct through localized diffusion region 138 that spans an area coming into contact with gate region 146 to output signal line 112. However, it may also be appreciated from the diagram of FIG. 1A, that electric currents $I_6$ and $I_7$ may conduct through a somewhat larger localized diffusion region that spans an area coming into contact with two gate regions. For example, electric current $I_6$ may conduct through localized diffusion region 134 that spans an area coming into contact with gate regions 142 and 143 to output signal line 112. Likewise, electric current $I_7$ may conduct through localized diffusion region 136 that spans an area coming into contact with gate regions 144 and 145 to output signal line 112. As shown in FIG. 1A, conductors positioned between common source voltage 110 ($V_{SS}$) and localized diffusion regions may comprise substantially similar width and thickness dimensions Thus, at least in particular embodiments, unequal current flow distribution among conductors carrying currents $I_1$-$I_8$ from common source voltages 105 and 110 to localized diffusion regions of a semiconductor film may bring about correspondingly unequal resistive losses. Accordingly, when electric currents $I_2$ and $I_3$ comprise values substantially equal to two times electric currents $I_1$ and $I_4$ (e.g., $I_2 \approx 2 \times I_1$ and $I_3 \approx 2 \times I_4$), resistive losses through conductors conveying electric currents $I_1$ and $I_2$, for example, may be expected vary correspondingly. Likewise, resistive losses through conductors conveying electrical currents $I_4$ and $I_3$, may also be expected to vary in a corresponding manner. Further, with respect to electric currents $I_6$ and $I_7$ comprising values substantially equal to two times electric currents $I_5$ and $I_8$ (e.g., $I_6 \approx 2 \times I_5$ and $I_7 = 2 \times I_8$), resistive losses through conductors conveying electric currents $I_5$ and $I_6$ and $I_8$ and $I_7$, may also be expected to vary correspondingly.

Figure 1B:
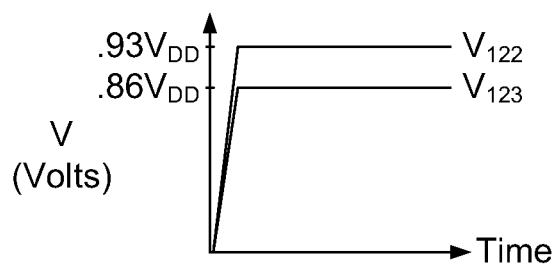
FIG. 1B illustrates magnitudes, as a function of time, of input signals present at localized diffusion regions of the arrangement of FIG. 1A, according to an embodiment.

FIG. 1B, illustrates magnitudes, as a function of time, of input signals present at localized diffusion regions 122 and 123, according to an embodiment (150). For example, referring back to FIG. 1A, electric current $I_1$ is indicated as conducting current from common source voltage 105 ($V_{DD}$) to localized diffusion region 122, which spans an area that comes into contact with gate region 141. Accordingly, under such conditions, as shown in FIG. 1B, a voltage present at localized diffusion region 122 ($V_{122}$) may comprise a value of about 93.0% of $V_{DD}$, which implies a voltage drop of about 7.0%. However, also in the of example of FIG. 1A, electric current $I_2$ is indicated as conducting current from common source voltage 105 ($V_{DD}$) to localized diffusion region 123, which spans an area that comes into contact with gate regions 142 and 143. Accordingly, under such conditions, as shown in FIG. 1B, a voltage present at localized diffusion region 123 ($V_{123}$) may comprise a value of, for example, about 86.0% of $V_{DD}$, which implies a voltage drop of about 14.0%. Thus, at least in particular embodiments, responsive to unequal current flow through conductors from a common source voltage to a localized diffusion region, a voltage magnitude present at localized diffusion regions may vary considerably. Additionally, although not specifically identified in FIG. 1B, similar variations may be expected in voltage magnitudes present at localized diffusion regions 127, 132, and 138 with respect to voltage magnitudes present at diffusion regions 126, 134, and 136.

Figure 2A:
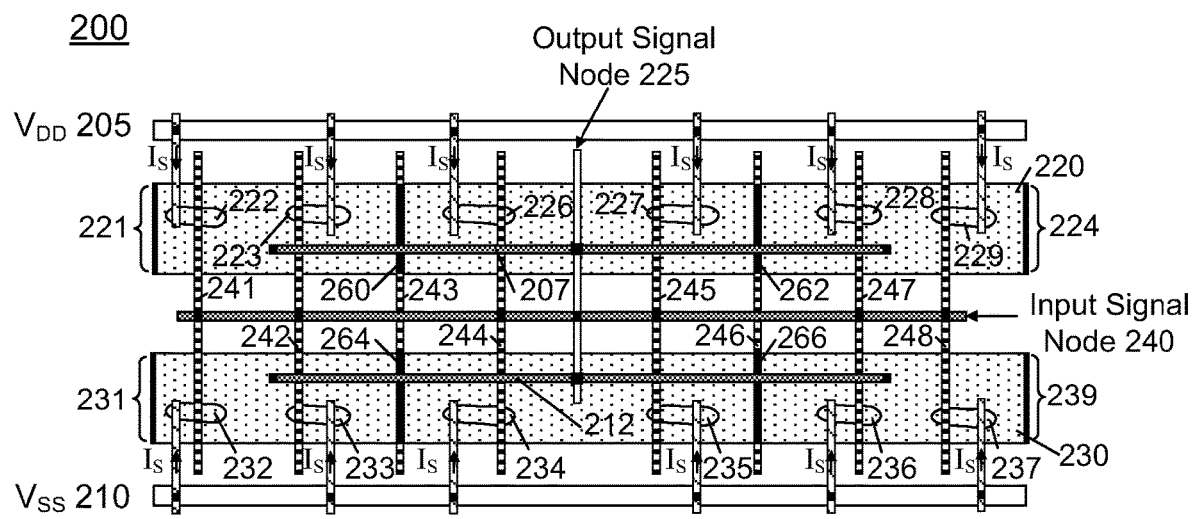
FIG. 2A, is a schematic diagram illustrating another arrangement of transistor gates capable of modifying driver signal characteristics, according to an embodiment.

FIG. 2A, is a schematic diagram (200) illustrating another arrangement of transistor gates capable of modifying driver signal characteristics, according to an embodiment. The arrangement of FIG. 2A includes many elements similar to those discussed with reference to FIG. 1A such as PMOS region 220 of a semiconductor film and NMOS region 230 of the semiconductor film, which may be fabricated at a device layer during front-end-of-line (FEOL) wafer fabrication processes. PMOS region 220 and NMOS region 230 may be substantially isolated from adjacent PMOS/NMOS regions, not shown in FIG. 2A, by way of etch boundary 221 (shown at the left side of PMOS region 220) and by way of etch boundary 224 (shown at the right side of PMOS region 220). Similarly, NMOS region 230 may be substantially isolated from adjacent NMOS regions by way of etch boundary 231 (shown at the left side of a NMOS region 230) and by way of etch boundary 239 (shown at the right side of NMOS region 230).

The diagram of FIG. 2A additionally shows gate regions 241, 242, 244, 245, 247, and 248, which may be in electrical contact with input signal node 240. Thus, responsive to a voltage signal of a sufficient magnitude at input signal node 240, electric current ($I_S$) may be conducted from common source voltage 205 ($V_{DD}$) to localized diffusion regions, such as localized diffusion regions 222, 223, 226, 227, 228, and 229. Conductors conveying electric current $I_S$ may be disposed in a spaced relation, such as comprising an approximate constant spacing interval between successive conductors; however, claimed subject matter is not limited in this respect. Rather, claimed subject matter is intended to embrace any spacing of conductors, such as an array of conductors, conveying an electric current. Additionally, and also in response to a voltage signal of a sufficient magnitude at input signal node 240, electric current may be conducted from common source voltage 210 ($V_{SS}$) to localized diffusion regions, such as localized diffusion regions 232, 233, 234, 235, 236, and 237. Electric currents conducted through localized diffusion regions may be coupled to output signal lines 207 and 212 for delivery to output signal node 225.

The diagram of FIG. 2A also indicates additional gate regions, such as gate regions 243 and 246. In such an embodiment, additional gate regions 243 and 246 may comprise floating gate regions of a semiconductor film, which are uncoupled from output signal lines 207/212 and, consequently, uncoupled from output signal node 225.

Accordingly, PMOS portion 260 and NMOS portion 264 of gate region 243 may present a high-impedance or insulative load to an electric current. Likewise, PMOS portion 262 and NMOS portion 266 of gate region 246 may also present a higher impedance or insulative load to an electric current. Accordingly, as shown in FIG. 2A, responsive to a significantly reduced or even negligible current conducted through PMOS portions 260, 262, 264, and 266, all electric currents from common source voltage 205 ($V_{DD}$) may comprise a substantially equivalent magnitude. Thus, as shown in FIG. 2A, equal (or least substantially equal) currents $I_S$ are shown as being conducted from common source voltage 205 to localized diffusion regions. Likewise, also as shown in FIG. 2A, all electric currents from common source voltage 210 ($V_{SS}$) may comprise at least substantially equal values (e.g., $I_S$).

Figure 2B:
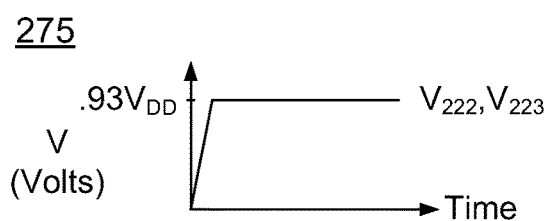
FIG. 2B illustrates a magnitude, as a function of time, of input signals present at first and second transistor gates of the arrangement of FIG. 2A, according to an embodiment.

FIG. 2B illustrates a magnitude, as a function of time, of input signals present at first and second transistor gates of the arrangement of FIG. 2A, according to an embodiment (275). It may be appreciated that such rapid attainment of a higher voltage at a localized diffusion region, when compared to FIG. 1B, may bring about a faster rise time of a signal present at, for example, output signal node 225. In certain embodiments, fabrication of additional gate regions, such as additional gate regions 243 and 246, may represent a favorable balance between additional area of a semiconductor wafer and more rapid rise time of signals at output signal notes. In the embodiment of FIG. 2A, wherein a number of polysilicon gate regions is increased from 6 gate regions to 8 gate regions, achieving an improvement in output signal rise time may outweigh increased wafer area requirements.

An increase in a number of gate regions, such as from 6 gate regions to 8 gate regions may bring about additional favorable outcomes, and claimed subject matter is not limited in this respect. For example, in particular embodiments, an increase in a number of gate regions may modify the stress effect of a semiconductor film, which, as previously described, may reduce time required for an output signal node to attain a threshold voltage magnitude. Thus, for the embodiment of FIG. 2A, responsive to increasing a width of PMOS region 220 of a semiconductor film, such as from a width corresponding to 6 gate regions to 8 gate regions, a separation between, for example, etch boundaries 221 and 224 to localized diffusion regions 226 and 227 may increase. Accordingly, a compressive stress effect, such as may be observed at localized diffusion regions 226 and 227, may operate to decrease rise time of output signals conducted through localized diffusion regions 226 and 227. Accordingly, at least in particular embodiments, responsive to such increases in separation, signal rise time of output signals conducted through localized diffusion regions 226 and 227 may decrease by, for example, between about 5.0% and about 15.0%, although claimed subject matter is intended to embrace all modifications, such as decreases, in output signal rise time responsive to insertion of floating gates in PMOS regions of a semiconductor film. In at least certain embodiments, increases and/or decreases in signal rise time of output signals may be dependent upon ambient temperature of a signal driver.

With respect to NMOS region 230, such increases in width responsive to insertion of floating gates may bring about an opposite outcome, such as, for example, a slight increase in fall time of an output signal at output signal node 225. In the embodiment of FIG. 2A, responsive to increasing a width of NMOS region 230 of a semiconductor film, such as from a width corresponding to 6 gate regions to 8 gate regions, a separation between, for example, etch boundaries 231 and 239 to localized diffusion regions 234 and 235 may increase. Accordingly, a tensile stress effect, such as may be observed at localized diffusion regions 234 and 235, may operate to increase fall time of output signals conducted through localized diffusion regions 234 and 235. Accordingly, at least in particular embodiments, responsive to such increases and separation, signal fall time of output signals conducted through localized diffusion regions 226 and 227 may increase by, for example, between about 0.5% and about 4.0% (referenced to a 6-gate driver), although claimed subject matter is intended to embrace all increases in output signal fall time responsive to insertion of floating gates in NMOS regions of a semiconductor film. In at least certain embodiments, increases and/or decreases in signal fall time of output signals may be dependent upon ambient temperature of a signal driver. These results may be summarized in Table I, below:

TABLE I

Change in Output Signal Rise and Fall Times Responsive to Increasing Number of Gates

| Number of Gates | Δ Rise Time | Δ Fall Time |
| --- | --- | --- |
| 8 | −5.0% to −15.0% | +0.5% to +4.0% |

Figure 3:
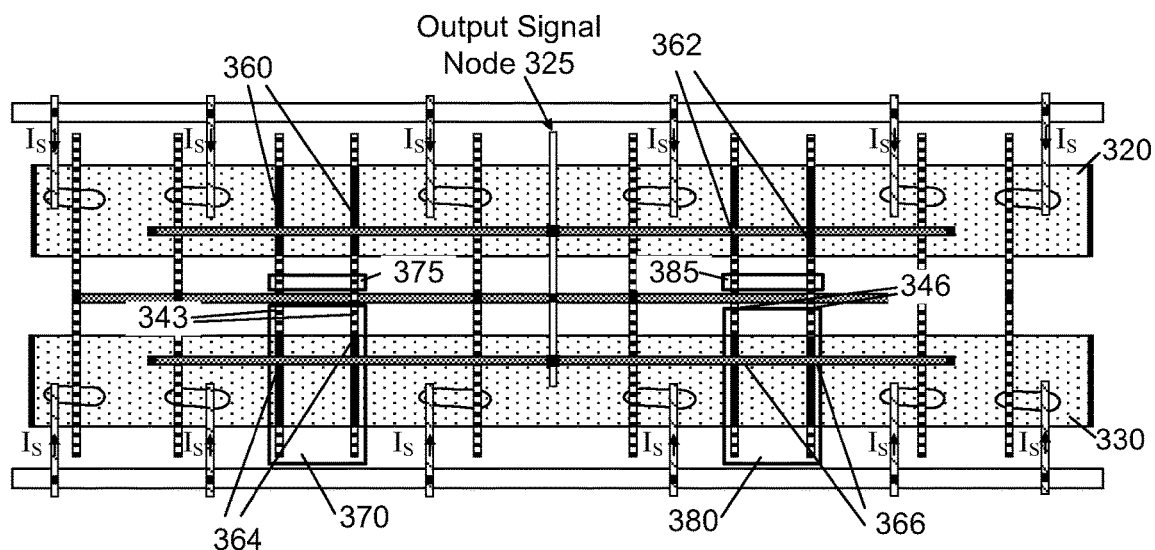
FIG. 3 is a schematic diagram illustrating another arrangement of transistor gates capable of modifying driver signal characteristics, according to an embodiment.

FIG. 3 is a schematic diagram (300) illustrating another arrangement of transistor gates capable of modifying driver output signal characteristics, according to an embodiment. In the embodiment of FIG. 3, which includes many components described in reference to the diagrams of FIG. 1A and FIG. 2A, such as localized diffusion regions, polysilicon gate regions, etch boundaries, input/output signal lines, and so forth. However, the schematic diagram of FIG. 3 differs from the schematic diagram of FIG. 2A in that additional gate region 243 of FIG. 2A has been replaced by two additional gate regions 343. Additional gate regions 343 comprise PMOS portions 360, located on or over PMOS region 320, as well as NMOS portions 364, located on or over NMOS region 330. The diagram of FIG. 3 additionally differs from the schematic diagram of FIG. 2A in that additional gate region 243 of FIG. 2A has been replaced by two additional gate regions 346. Additional gate regions 346 comprise PMOS portions 362, located on or over PMOS region 320, as well as NMOS portions 366, located on or over NMOS region 330. Thus, in view of the additional gate regions, a width dimension of PMOS region 320 and NMOS region 330 has been increased from a width corresponding to 8 gate regions to a width corresponding to 10 gate regions. In the diagram of FIG. 3, additional gate regions 343 and 346 may comprise floating gate regions of the semiconductor film, which are uncoupled from output signal lines.

In the diagram of FIG. 3, etch regions 370 and 380 indicate regions within which transistor gate material, such as polysilicon gate material, has been removed via a suitable etching process such as, for example, a dry etch process, wet etch process, an ion beam etch process, or the like. In addition to removal of gate material, which may comprise polysilicon, underlying diffusion regions may also be removed via a suitable etching process. The diagram of FIG. 3 additionally indicates etch regions 375 and 385, which lies between a PMOS region 320 and NMOS region 330, to indicate locations at which a discontinuity has been formed. Such discontinuity may operate to electrically isolate PMOS portion 360 (of gate regions 343) from NMOS portion 364, as well as to electrically isolate PMOS portion 362 (of gate regions 346) from NMOS portion 366.

In the embodiment shown in FIG. 3, etch regions 370 and 380 may bring about an increase in tensile stress observed at adjacent diffusion regions. Consequently, responsive to an increase in tensile stress observed at adjacent diffusion regions, a decrease in fall time of output signals conducted through adjacent diffusion regions may be observed at output signal node 325. In one embodiment, as indicated in Table II, below, a change in fall time of output signals (compared to a 6-gate driver of, for example, FIG. 1A) may range from about −8.0% to +2.0%, although claimed subject matter is not limited in this respect. As previously mentioned, when output signal node 325 is capable of providing signals that rapidly fall below a threshold voltage, subsequent operations may be initiated.

TABLE II

Change in Output Signal Rise and Fall Times Responsive to Increasing Number of Gates (Etch at NMOS Region)

| Number of Gates | Δ Rise Time | Δ Fall Time |
| --- | --- | --- |
| 10 (with NMOS etch regions) | −5.0% to −15.0% | −8.0% to +2.0% |

Figure 4:
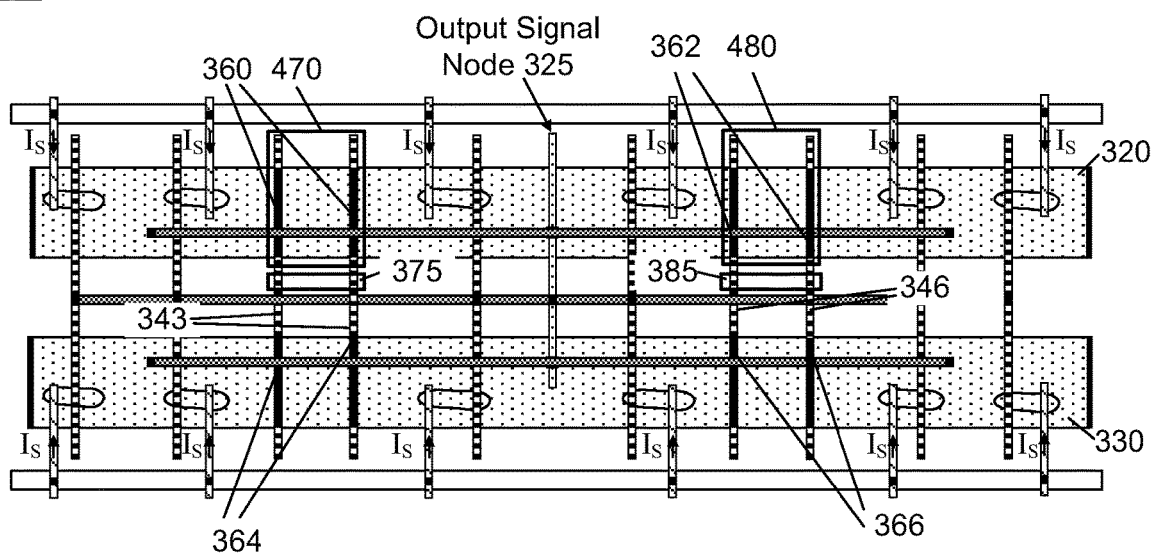
FIG. 4 is a schematic diagram illustrating another arrangement of transistor gates capable of modifying driver output signal characteristics, according to an embodiment.

FIG. 4 is a schematic diagram (400) illustrating another arrangement of transistor gates capable of modifying driver output signal characteristics, according to an embodiment. FIG. 4 includes many components described in reference to the diagrams of FIG. 3, such as etch regions, which indicate regions within which transistor gate material, such as polysilicon gate material, has been removed via a suitable etching process. However, FIG. 4 differs from FIG. 3 in that etch region 470 lies on or over PMOS portions 360 of gate regions 343. Additionally, in FIG. 4, etch region 480 lies on or over PMOS portions 362 of gate regions 343.

In the embodiment shown in FIG. 4, etch regions 470 and 480 may bring about an increase in compressive stress observed at adjacent diffusion regions. Consequently, responsive to an increase in compressive stress observed at adjacent diffusion regions, small or negligible changes (compared to a 6-gate driver of, for example, FIG. 1A) may be observed in rise time and/or fall time of signals at output signal node 325, as indicated in Table III, below:

TABLE III

Change in Output Signal Rise and Fall Times Responsive to Increasing Number of Gates (Etch at PMOS Region)

| Number of Gates | Δ Rise Time | Δ Fall Time |
| --- | --- | --- |
| 10 (with PMOS etch regions) | −1.0% to +2.0% | −1.0% to +1.0% |

However, in particular embodiments, in addition to changes in rise time and fall time of output signals observed at output signal node 325, etching of PMOS and NMOS portions of gate regions, such as gate regions 343 and 346 of FIGS. 3 and 4, may bring about changes in other signal driver parameters such as "off" state leakage current. In some embodiments, such as indicated Table IV, below, a decrease in signal rise and signal fall times may be accompanied by increases in "off" state leakage current, such as currents $I_S$ coupled a common source voltage to a diffusion region. Additionally, in some embodiments, increases in signal rise and signal fall times may be accompanied by decreases in "off" state leakage current.

TABLE IV

Change in Output Signal Rise and Fall Times Responsive
to Increasing Number of Gates (Etch at PMOS Region)

| Number of Gates | Δ Rise Time | Δ Fall Time | Δ "Off" State Leakage Current (PMOS) | Δ "Off" State Leakage Current (NMOS) |
|---|---|---|---|---|
| 8 | −5.0% to −15.0% | +0.5% to +4.0% | +55.0% | ≈0.0% |
| 10 (with NMOS etch regions) | −5.0% to −15.0% | −8.0% to +2.0% | +55.0% | ≈0.0% |
| 10 (with PMOS etch regions) | −1.0% to +2.0% | −1.0% to +1.0% | −60.0% | −31.0% |

Thus, as indicated in Table IV, design of a signal driver may involve balancing desirable but potentially incompatible features. Such features may include width of PMOS and NMOS semiconductor regions (such as widths corresponding to 6 gates, 8 gates, 10 gates), one or more of driver signal rise and fall time, fabrication process complexity (such as etching of additional gates to remove gate material and material from diffusion regions), and so forth. Thus, in a particular example in which decreased rise time of an output signal of a driver is favored, and in which neither "off" state leakage current nor fall time of an output signal are of significant concern, a system designer may select a signal driver having 8 gates. In another particular example, in which both decreased rise and fall times of output signals of a driver are favored, and in which "off" state leakage current is not of significant concern, a system designer may select a signal driver having 10 gates fabricated via a process that includes etching of additional (e.g., floating) NMOS gates. It may be appreciated that additional factors may be considered, such as material selection, dopant concentrations of localized diffusion regions, etc., and claimed subject matter is not limited in this respect.

Figure 5:
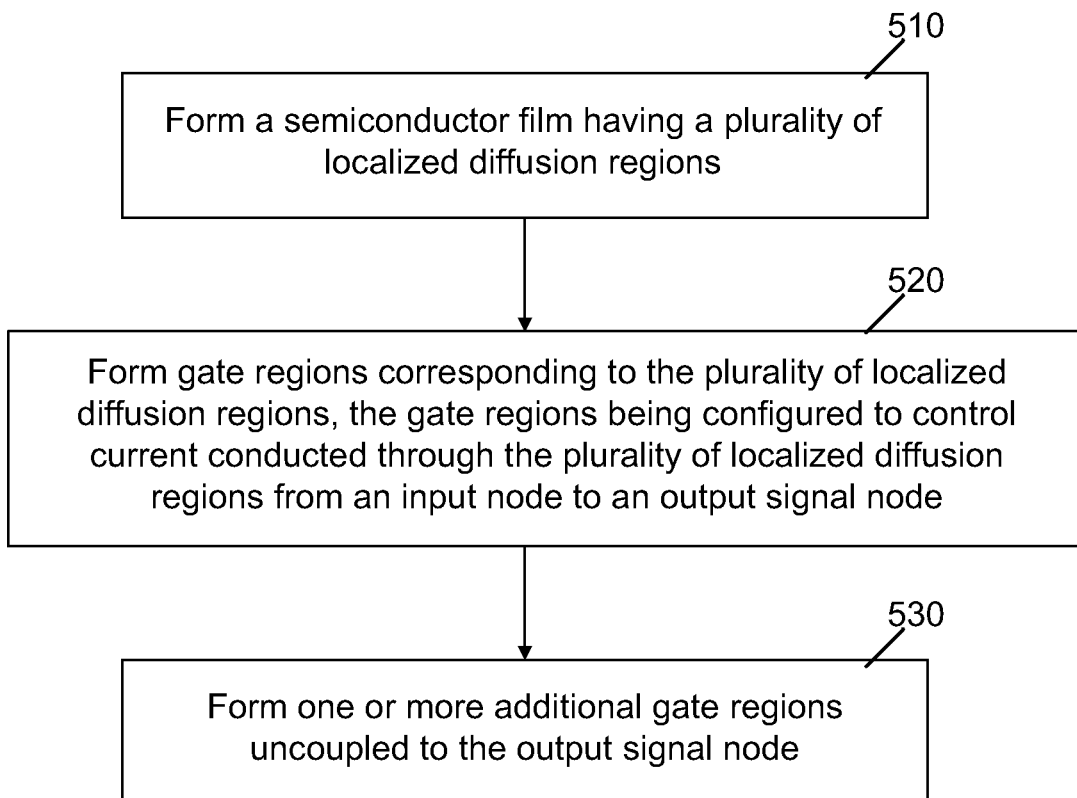
FIG. 5 is a flow chart for a method for forming a transistor gate arrangement to modify driver signal characteristics, according to an embodiment.

FIG. 5 is a flow chart (500) for a method for forming a transistor gate arrangement to modify driver signal characteristics, according to an embodiment. Example implementations may include fewer blocks than those shown in FIG. 5 or blocks occurring in an order different than may be identified, or any combination thereof. The method of FIG. 5 may begin at block 510, which may comprise forming a semiconductor film having a plurality of localized diffusion regions. In an embodiment, a semiconductor film may comprise PMOS and NMOS regions, such as PMOS region 220 and NMOS region 230 of FIG. 2A, formed over an appropriate substrate during a front-end-of-line wafer fabrication process. Localized diffusion regions, such as localized diffusion regions 222, 223, 226, 227, 228, and 229 may be fabricated on PMOS region 220 of FIG. 2A. Additional localized diffusion regions, such as regions 232, 233, 234, 235, 236, and 237 may be fabricated on a NMOS region 230 of FIG. 2A. The semiconductor film may be fabricated utilizing any appropriate fabrication process, such as atomic layer deposition, chemical vapor deposition, sputter deposition, and so forth. Additionally, localized diffusion regions may comprise any shape and may be formed utilizing any suitable dopant type and concentration, and claimed subject matter is not limited in this respect.

The method may continue at block 520, which may comprise forming gate regions corresponding to the plurality of localized diffusion regions. The gate regions may be configured so as to control an electric current conducted through the plurality of localized diffusion regions. In some embodiments, current may be conducted from an input node to an output signal node. The method may continue at block 530, which may comprise forming one or more additional gate regions, such as floating gate regions, which may be uncoupled to an output signal node. The method may additionally include increasing tensile stress observed at diffusion regions responsive to etching NMOS portions of gates, such as NMOS portion 364 of NMOS gate region 343. In another embodiment, the method may include increasing compressive stress observed at diffusion regions responsive to etching PMOS portions of gates, such as PMOS portions 362 of PMOS gate region 346. In particular embodiments, the method may further comprise forming a discontinuity, which may operate to isolate a PMOS portion, such as PMOS region 320 of a semiconductor film from an NMOS portion, such as NMOS region 330.

In the preceding description, in a particular context of usage, such as a situation in which a metal layer, for example, is being discussed, a distinction exists between being "on" and being "over." As an example, deposition of a substance "on" a substrate refers to a deposition involving direct physical contact without an intermediary. In contrast, "over" refers to a situation in which one or more intermediaries, such as one or more intermediary substances, are present between the substance deposited and the substrate so that the substance deposited is not necessarily in direct physical contact with the substrate.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope of the invention as defined by the appended claims. For example, various combinations of the features of the dependent claims could be made with the features of the independent claims without departing from the scope of the present invention.

What is claimed is:

1. A device to provide an electrical signal, comprising:
    an array of voltage signal input conductors, disposed in a spaced relation over a semiconductor film, to provide the voltage signal to corresponding localized diffusion regions of the semiconductor film, wherein the semiconductor film has one or more gate regions coupled to a common switched output signal node to provide an output signal responsive to a signal at an input signal node, wherein the one or more gate regions correspond in number to the localized diffusion regions; and
    at least one additional gate region of the semiconductor film, wherein the at least one additional gate region is uncoupled to the common switched output signal node.

2. The device of claim 1, wherein the at least one additional gate region spans NMOS and PMOS regions of the semiconductor film.

3. The device of claim 1, further comprising one or more etched regions of a corresponding number of localized diffusion regions coincident with the at least one additional gate region of the semiconductor film.

4. The device of claim 3, wherein the one or more etched regions of the at least one additional gate region of the semiconductor film is located at a NMOS region of the semiconductor film.

5. The device of claim 3, wherein the one or more etched regions of the at least one additional gate region of the semiconductor film is located at a PMOS region of the semiconductor film.

6. The device of claim 1, further comprising one or more etched regions between a NMOS region of the semiconductor film and a PMOS region of the semiconductor film, wherein the one or more etched regions are configured to provide substantial electrical isolation of the NMOS region of the at least one additional gate region with respect to the PMOS region of the at least one additional gate region.

7. The device of claim 1, wherein successive localized diffusion regions of the semiconductor film are separated by a substantially constant interval.

8. A device to provide electrical signals to a plurality of external devices, comprising:
 a plurality of voltage signal input conductors, separated by a substantially constant spacing over a semiconductor film, to provide the voltage signal to corresponding localized diffusion regions of the semiconductor film, wherein the semiconductor film has one or more gate regions coupled to a common switched output signal node to provide an output signal responsive to a signal at an input signal node, wherein the one or more gate regions overlay the corresponding localized diffusion regions; and
 at least one additional gate region of the semiconductor film, wherein the at least one additional gate region is uncoupled from the common switched output signal node.

9. The device of claim 8, further comprising at least one etched region at least approximately overlaying the additional gate region of the semiconductor film.

10. The device of claim 9, wherein the at least one etched region overlays a NMOS region of the semiconductor film.

11. The device of claim 9, wherein the at least one etched region overlays a PMOS region of the semiconductor film.

12. The device of claim 8, further comprising a discontinuity in the at least one additional gate region, wherein the discontinuity substantially electrically isolates a first portion of the at least one additional gate region from a second portion of the at least one additional gate region.

13. The device of claim 12, wherein the discontinuity in the at least one additional gate region occurs between an NMOS region of the semiconductor film and a PMOS region of the semiconductor film.

* * * * *